US012117512B2

(12) United States Patent
Norman et al.

(10) Patent No.: US 12,117,512 B2
(45) Date of Patent: Oct. 15, 2024

(54) DEEP LEARNING-BASED EDDY CURRENT CORRECTION

(71) Applicant: ARTERYS INC., San Francisco, CA (US)

(72) Inventors: Berk Dell Norman, San Francisco, CA (US); Jesse Lieman-Sifry, San Francisco, CA (US); Sean Patrick Sall, San Francisco, CA (US); Daniel Irving Golden, Palo Alto, CA (US); Hok Kan Lau, San Francisco, CA (US)

(73) Assignee: Arterys Inc., San Francisco, CA (US)

( * ) Notice: Subject to any disclaimer, the term of this patent is extended or adjusted under 35 U.S.C. 154(b) by 424 days.

(21) Appl. No.: 17/430,293

(22) PCT Filed: Feb. 11, 2020

(86) PCT No.: PCT/US2020/017625
§ 371 (c)(1),
(2) Date: Aug. 11, 2021

(87) PCT Pub. No.: WO2020/167736
PCT Pub. Date: Aug. 20, 2020

(65) Prior Publication Data
US 2022/0155398 A1    May 19, 2022

Related U.S. Application Data

(60) Provisional application No. 62/806,475, filed on Feb. 15, 2019.

(51) Int. Cl.
*G01R 33/565* (2006.01)
*G01R 33/56* (2006.01)
(Continued)

(52) U.S. Cl.
CPC .......... *G01R 33/56518* (2013.01); *G01R 33/5602* (2013.01); *G01R 33/5608* (2013.01);
(Continued)

(58) Field of Classification Search
CPC .......... G01R 33/56518; G01R 33/5602; G01R 33/5608; G01R 33/563; G06T 7/11;
(Continued)

(56) References Cited

U.S. PATENT DOCUMENTS

| 6,191,582 | B1 * | 2/2001 | Zur ............... G01R 33/56518 |
| | | | 324/309 |
| 10,117,597 | B2 * | 11/2018 | Beckers ............ A61B 5/0044 |
| 2003/0099388 | A1 * | 5/2003 | Doi ..................... G06T 5/50 |
| | | | 382/131 |

(Continued)

FOREIGN PATENT DOCUMENTS

| CN | 115222781 A | * | 10/2022 | |
| WO | WO-2009097612 A1 | * | 8/2009 | ............ G01R 33/56 |
| WO | WO-2015109254 A2 | * | 7/2015 | ........... A61B 5/0044 |

OTHER PUBLICATIONS

Y. Feng-yan and Y. Ming-jin, "Computation of 2D and 3D Eddy Currents of Eddy Current Retarders," 2010 International Conference on Electrical and Control Engineering, Wuhan, China, 2010, pp. 3478-3481, doi: 10.1109/iCECE.2010.846. (Year: 2010).*

(Continued)

*Primary Examiner* — Charles T Shedrick
(74) *Attorney, Agent, or Firm* — Seed Intellectual Property Law Group LLP

(57) ABSTRACT

Systems and methods for providing improved eddy current correction (ECC) in medical imaging environments. One or more of the embodiments disclosed herein provide a deep learning-based convolutional neural network (CNN) model trained to automatically generate an ECC mask which may be composited with two-dimensional (2D) scan slices or four-dimensional (4D) scan slices and made viewable (Continued)

through, for example, a web application, and made manipulable through a user interface thereof.

24 Claims, 4 Drawing Sheets

(51) Int. Cl.
  *G01R 33/563* (2006.01)
  *G06T 7/11* (2017.01)
  *G06T 7/194* (2017.01)
(52) U.S. Cl.
  CPC .............. *G01R 33/563* (2013.01); *G06T 7/11* (2017.01); *G06T 7/194* (2017.01); *G06T 2207/10076* (2013.01); *G06T 2207/10088* (2013.01); *G06T 2207/20081* (2013.01); *G06T 2207/20084* (2013.01); *G06T 2207/30048* (2013.01)
(58) Field of Classification Search
  CPC ........... G06T 7/194; G06T 2207/10076; G06T 2207/10088; G06T 2207/20081; G06T 2207/20084; G06T 2207/30048; G06N 3/045; G06N 3/047; G06N 3/084; G06N 3/08
  See application file for complete search history.

(56) References Cited

U.S. PATENT DOCUMENTS

| | | | | |
|---|---|---|---|---|
| 2004/0044280 | A1* | 3/2004 | Paley | G01R 33/445 600/410 |
| 2005/0218894 | A1* | 10/2005 | Miyawaki | G01R 33/56518 324/309 |
| 2009/0058418 | A1* | 3/2009 | Josan | G01R 33/54 324/309 |
| 2010/0102816 | A1* | 4/2010 | Nielsen | G01R 33/5613 324/309 |
| 2014/0125333 | A1* | 5/2014 | Hanada | G01R 33/56572 324/318 |
| 2014/0328529 | A1* | 11/2014 | Koceski | G06T 7/11 382/131 |
| 2016/0338613 | A1* | 11/2016 | Beckers | A61B 5/021 |
| 2018/0144828 | A1* | 5/2018 | Baker | G16H 30/40 |
| 2018/0256041 | A1* | 9/2018 | Dormer | G16H 10/60 |
| 2022/0155398 | A1* | 5/2022 | Norman | G01R 33/5602 |
| 2023/0306595 | A1* | 9/2023 | Leuthardt | G16H 30/40 |

OTHER PUBLICATIONS

International Preliminary Report on Patentability, mailed Aug. 26, 2021, for International Application No. PCT/US2020/017625, 8 pages.
International Search Report and Written Opinion, mailed Sep. 3, 2020, for International Application No. PCT/US2020/017625, 11 pages.
Kayalibay et al., "CNN-based Segmentation of Medical Imaging Data," arXiv:1701.03056v2 [cs.CV], Jul. 25, 2017, 24 pages.
Zhou et al., "A Fixed-Point Model for Pancreas Segmentation in Abdominal CT Scans," arXiv:1612.08230v4 [cs.CV], Jun. 21, 2017, 8 pages.

* cited by examiner

DEEP LEARNING-BASED EDDY CURRENT CORRECTION

FIELD OF TECHNOLOGY

This disclosure relates generally to medical imaging applications, and, more particularly, to a method of eddy current correction utilizing a deep learning-based convolutional neural network (CNN).

BACKGROUND

In the course of generating a magnetic resonance (MR) image, an MRI utilizes rapidly changing magnetic fields, which naturally generate swirling eddy currents. These eddy currents often introduce distortions and noise in an MR image, causing intensity values to be misrepresented. This can lead to drastically miscalculated measurements, such as flow velocity measurements calculated by a phase-contrast ("PC") MRI exhibiting two dimensional ("2D scan") or four-dimensional ("4D scan") flow MR velocity encoding.

Current solutions to account for the effect of eddy currents include fitting a tri-linear interpolation function to the observed velocities in known static tissue and utilizing the function to estimate the false eddy current contribution to measured velocity in non-static tissue.

Static tissue refers to tissue within a scan that is assumed to have no flow throughout the tissue. Static tissue may include muscle, fat, bones, tissue between the body and chest wall, abdomen, and liver. Non-static tissue refers to tissue within a scan that is assumed to have flow. Non-static tissue comprises the mediastinum, the heart, the brain, the lungs, and the background air around the scan.

U.S. patent application Ser. No. 10/117,597 discloses one or more embodiments of a correction method in which an eddy current correction (ECC) mask is generated based on an interpolation function and overlays a scan. Ideally, the mask represents and obscures static tissue, but post-processing by a radiologist is usually required to fine tune the mask by manipulating pairs of interdependent UI-based sliders associated with pixel intensity thresholds. This filtering method is tedious to use since it requires adjusting min/max thresholds for both static and non-static tissue. However, eddy currents may still create artifacts in pixel intensity—outliers that unduly expand or narrow the scope of the ECC mask and thus avoid the filter and must be manually annotated, i.e., by manually shaping a supplemental mask representing static or non-static tissue. Although default threshold values may provide a first step, this intensity binning approach still requires the radiologist to perform tedious and often arbitrary work outside the scope of the diagnosis.

Thus, there exists a need for an automated system for effectively attenuating the effect of eddy currents on 2D/4D scans, especially cardiac scans, without requiring a radiologist to perform onerous pre-processing before rendering a medical diagnosis.

BRIEF DESCRIPTION OF THE DRAWINGS

The embodiments of this invention are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Various applications, methods and systems are disclosed herein to provide improved ECC in medical imaging environments. More specifically, the embodiments disclosed herein describe a deep learning-based CNN model trained to automatically generate an ECC mask which may be composited with 2D scan slices or 4D scan slices and made viewable through, for example, a web application, and made manipulable through a user interface thereof.

Figure 1:
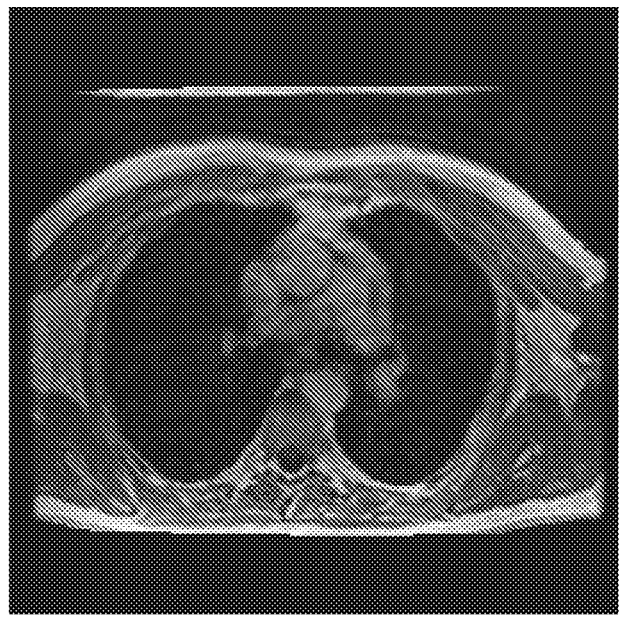
FIG. 1 shows an exemplary slice of an axial 4D flow scan and an exemplary corresponding ECC mask.
Figure 1:
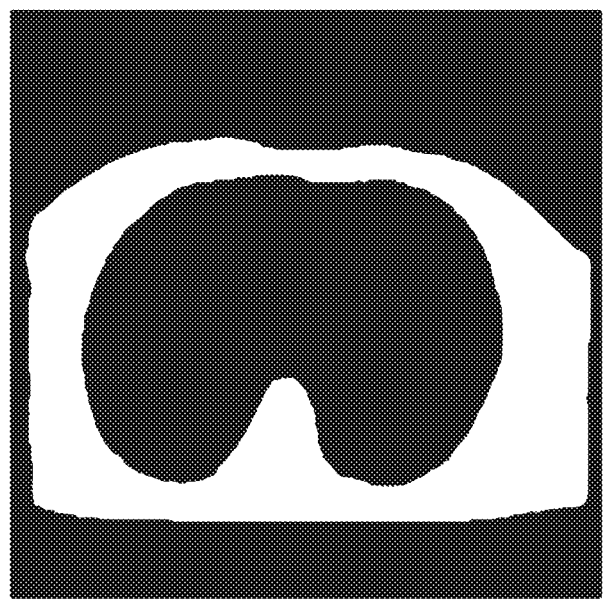

Referring to FIG. 1, an exemplary slice of a 4D flow scan 100 and a corresponding ECC mask 110 is shown. In one or more embodiments, the ECC mask 110 as shown may be one of a series of probability maps corresponding to the probability for which pixels are static tissue (shown in white) and which are non-static tissue (shown in black). ECC mask 110 may demonstrate an exemplary ECC mask which may be similar to that generated by a radiologist.

In at least one embodiment, generating an accurate ECC mask generation algorithm may require iteratively training, validating, and testing the results of a CNN model by using a set of input data. The input data may comprise two-dimensional, three-dimensional, and/or four-dimensional batches of 2D and 4D flow MR image slices. The input data may also comprise ground truth ECC masks for corresponding MR image slices, preferably representing a radiologist's delineation of static tissue. In general, the input data comprises a training subset, a validation subset, and a testing subset. It will be appreciated that neither the training subset, nor any other subset, may prevent the trained CNN model from applying to a data subset of the same or greater dimensionality than the input data.

In at least one embodiment, building a reliable CNN model may involve inputting the training subset of the input data into a CNN initialized with random weights, iteratively updating the weights based on a loss function calculated from the difference between the ground truth ECC masks of the training subset and a prediction generated by the CNN model, and evaluating the performance of the trained CNN using the testing subset.

Figure 2:
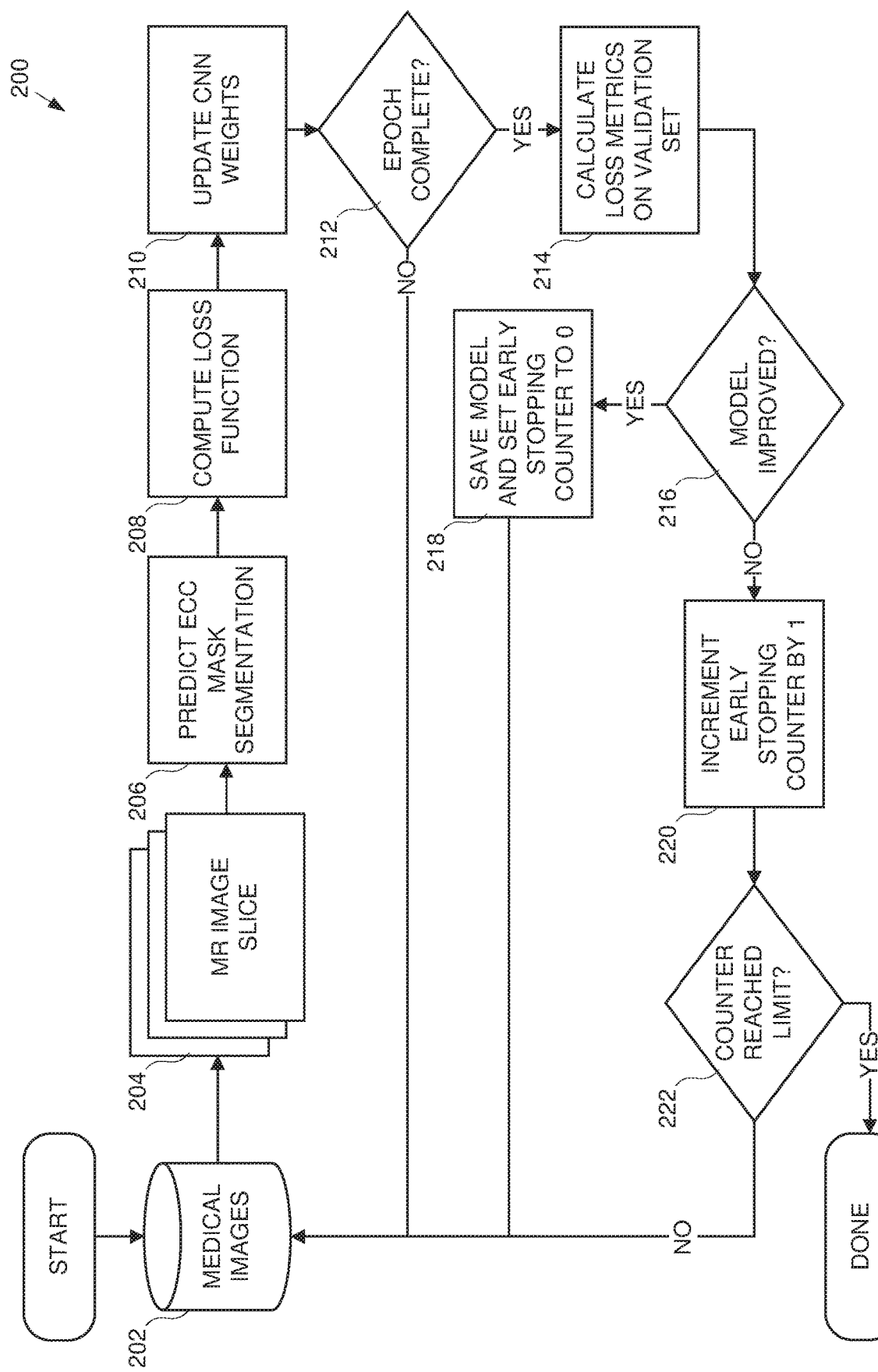
FIG. 2 is a flow diagram of a process for training a deep learning-based CNN model to generate ECC masks.

Referring to FIG. 2, a flow diagram of a process 200 for training a deep learning-based CNN model to generate ECC masks is shown. As a result of the training process 200, the CNN model accurately generates ECC masks which may be utilized to segment corresponding MR image slices to static and non-static tissue segments.

In a step 202, annotated medical images are read, which may include 2D and/or 4D axial, sagittal, and coronal scans. Annotated image slices may be fed into the CNN in step 204. Annotations may include a pre-generated ECC mask representing a radiologist's best determination of an ECC mask for the corresponding MR image slice. Thus, the annotations represent the ground truth against which CNN model results may be compared.

In step 206 the CNN generates an ECC mask segmentation prediction as discussed herein. The output of the CNN may be a probability map of static tissue, e.g., a tensor comprising per-pixel probability of being static tissue. In step 208, a differentiable loss function is calculated based on a comparison between the CNN ECC mask prediction and the pre-generated ECC mask annotations associated with corresponding image slices. The differentiable loss function includes, but is not limited to: weighted and unweighted cross entropy, weighted and unweighted L2 loss, log dice index, and log jaccard index. In step 210, backpropagation takes place and weights are updated according to an adaptive learning rate optimization algorithm, such as Adam optimization. Other optimizers, such as stochastic gradient descent (SGD), RMSprop, Adagrad, and Nadam are within the scope of the exemplary embodiments described herein.

In step 212, the system may determine whether an epoch is complete (i.e., when every image slice has been fed to the CNN once). If the epoch is incomplete, additional MR images and constituent slices are fed into the CNN and steps 202-212 repeat. If the epoch is complete, in step 214 loss metrics are calculated on the validation subset to determine whether the CNN model has improved since the last epoch. In step 216, the system determines whether the CNN model improved; if so, the CNN model is saved and an early stopping counter is set to 0 in step 218. Subsequently training continues for another epoch (i.e., steps 202-216 repeat). In step 220, if the CNN model did not improve, the early stopping counter is incremented by 1. In a step 222, if the counter has reached its limit, the weights from the last loss improvement may be used. If the counter has not reached its limit, steps 202-220 are repeated. The early stopping counter defines a criterion for preventing overfitting.

Figure 3:
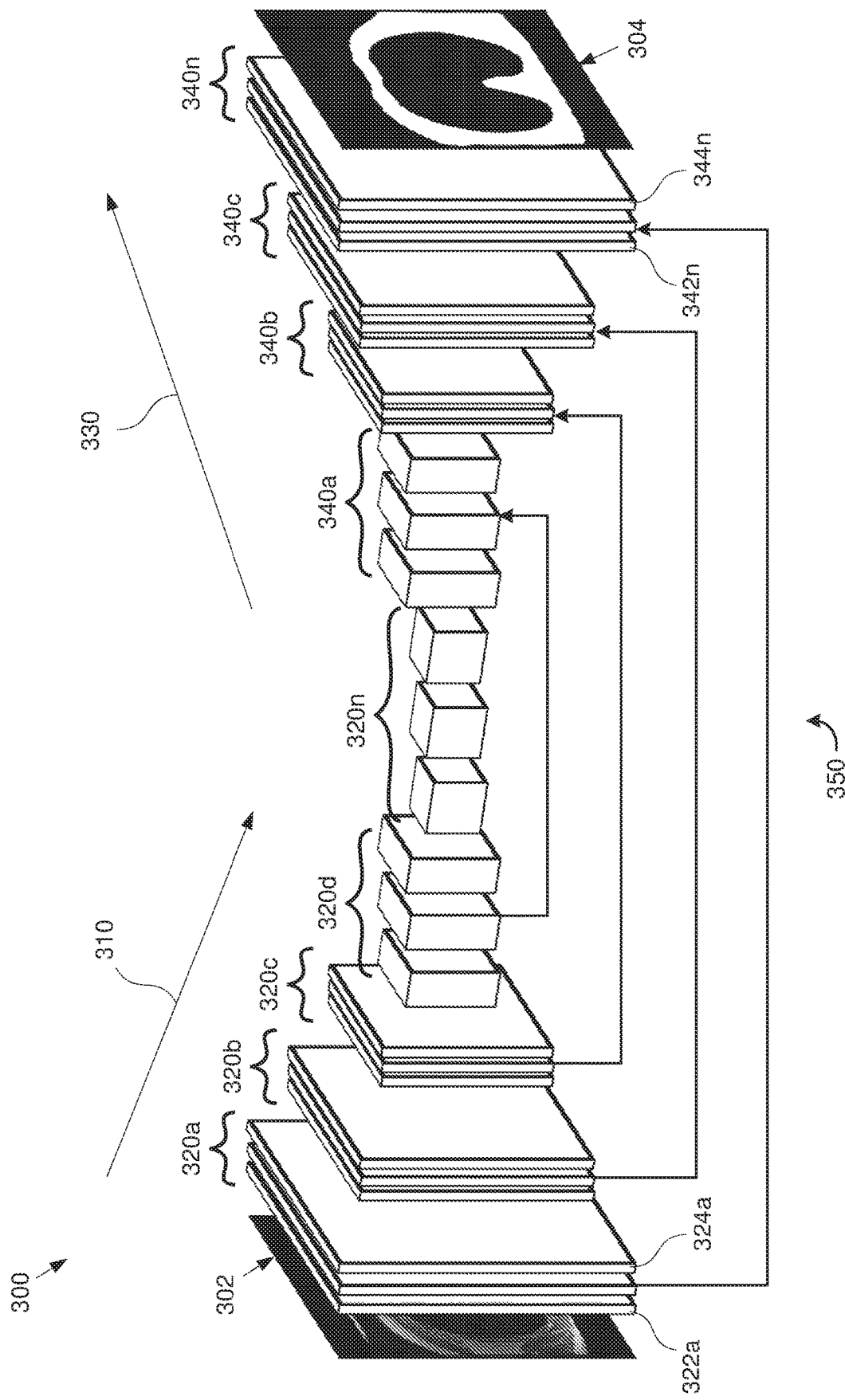
FIG. 3 is a diagram of a deep learning-based CNN architecture, according to one or more embodiments.

Referring to FIG. 3, an exemplary CNN 300 architecture is shown. A related CNN architecture can be seen in U.S. Patent Application Pub. No. 2018/0218497, which is incorporated by reference herein.

In at least one embodiment, the CNN 300 may comprise a contracting path 310 and an expanding path 330. The contracting path 310 may comprise one or more contractions 320a-n, each contraction comprising one or more convolutional layers, e.g., convolutional layer 322a, and one or more pooling layers, e.g., pooling layer 324a. Each contraction serves to double the number of feature maps and halve the resolution of input data (e.g., input image data 302 for contraction 320a). Each pooling layer is preceded by at least one convolutional layer. In at least one embodiment, the contracting path 310 comprises four contractions, each comprising at least two convolutions.

In at least one embodiment, the expanding path 330 may comprise one or more expansions 340a-n, each expansion comprising one or more convolutional layers, e.g., convolutional layer 342n, and one or more upsampling layers, e.g., upsampling layer 344n. Each expansion serves to halve the number of feature maps and double the resolution of the input data. Each upsampling layer is preceded by at least one convolutional layer and comprises at least one of: an upsampling operation coupled with an interpolation operation with a learned kernel, or an upsampling operation followed by an interpolation operation. In at least one embodiment, the expanding path 330 comprises four expansions, each comprising at least two convolutions. The CNN 300 may also be configured to concatenate corresponding contractions and expansions through skip connections 350. Concatenation serves to contextualize the results of the expansion path 330 with the global information intrinsic to the contracting path 310.

Once the CNN model is trained as described above, additional post-processing steps may be applied to the outputted ECC mask 304 to improve the quality of segmentation both qualitatively and quantitatively. Post-processing techniques which may be used include, but are not limited to: conditional random fields, Gaussian blurring, dilation, erosion, hole filling, histogram equalization, and Gaussian convolving. A post-processed ECC mask may be evaluated using the validation dataset. Post-processing is intended to improve the results of the CNN-generated ECC mask 304 and does not affect the CNN model weights. It will be appreciated that other post-processing techniques may be used to improve ECC mask viewability and such techniques are within the scope of the exemplary embodiments.

The model pipeline (the trained CNN model combined with post-processing techniques) may be finalized and subsequently utilized to infer ECC mask predictions from inputted MR images.

Figure 4:
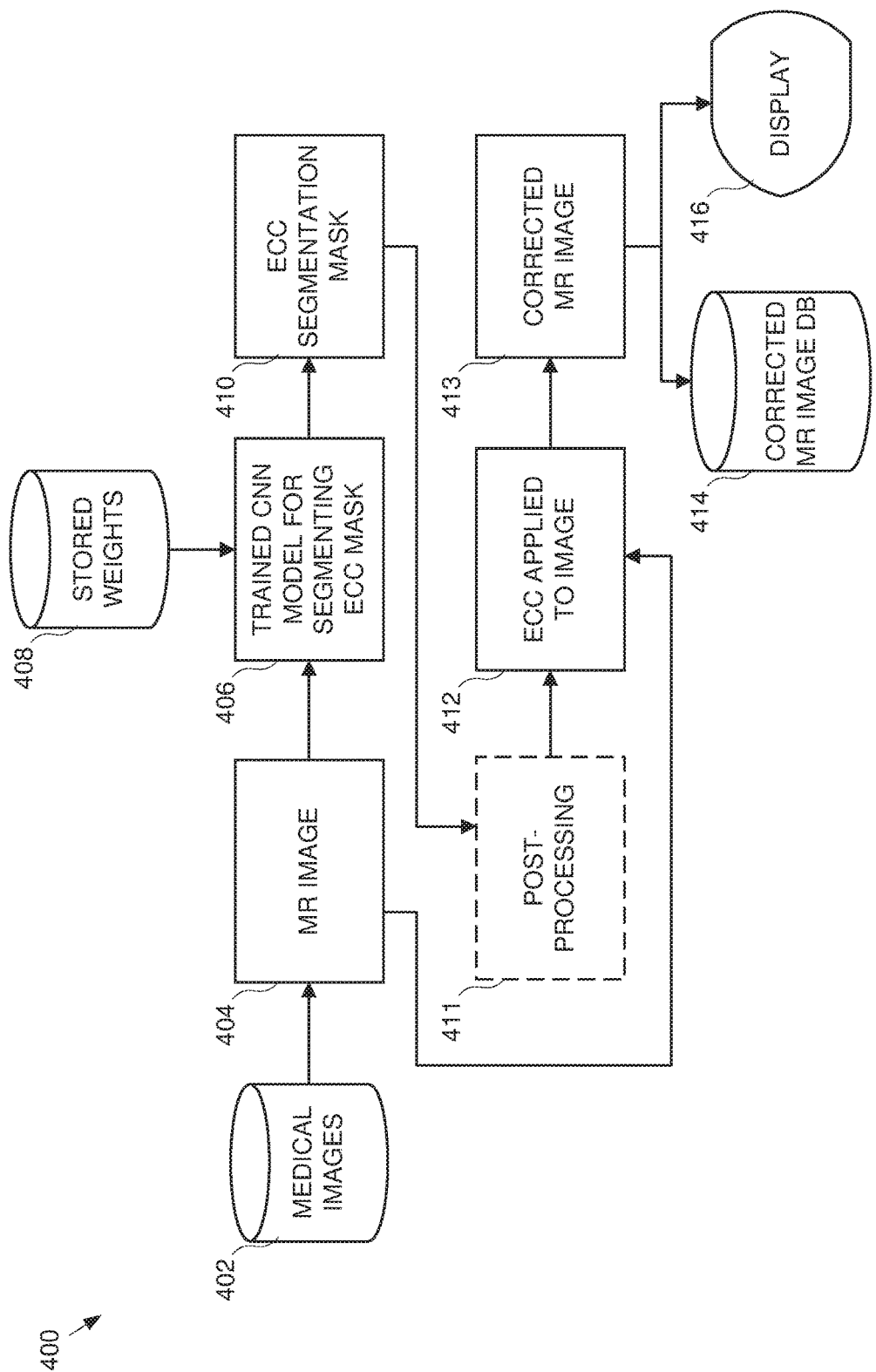
FIG. 4 is a flow diagram of a CNN model inference process for generating ECC masks for MR images slices.

Referring to FIG. 4, an exemplary model inference process 400 is shown in which medical images 402 are separated and an MR image 404 is fed into a trained CNN model for segmenting ECC masks 406. The CNN model may utilize stored weights 408 (i.e., weights stored in step 218) to generate an ECC segmentation mask 410. The ECC segmentation mask may undergo one or more optional post-processing steps 411 (as mentioned above) before being applied to the MR image 404 in a step 412 to generate a corrected MR image 413. The step 412 of applying the segmentation mask 410 may involve applying a piecewise linear fitting function or a polynomial fitting function on the MR image 404. The corrected MR image 413 may be stored in a corrected MR image slice database 414 and/or displayed through a display device 416.

A web application may be used to apply and/or modify the inference. Such a web application may be used to, inter alia, view and filter DICOM images. In one embodiment, the trained CNN model may automatically infer the ECC segmentation mask 410 upon viewing a 2D or 4D scan and overlay the ECC segmentation mask 410 on the image to signify an area deemed to be static or non-static. In the case of an automatic inference, the CNN model may default to a particular probability threshold cutoff (e.g., 0.5) for which pixels belong to static or non-static tissue.

In at least one embodiment, the trained CNN model may automatically infer an ECC segmentation mask 410 and preselect a default probability threshold cutoff, but may also allow for manipulation of the probability threshold cutoff. For example, the web application may provide a user interface element, such as a slider. Upon changing the slider setting, the selected probability map may be referenced and an interpolation function may be executed based on the present pixel intensity inherent in static and non-static tissue to effectively apply ECC.

In one or more embodiments, additional post-processing steps may be applied to the CNN output to evenly distribute per-pixel probability values. This post-processing may cause segmentation mask application to be more noticeable as manipulation of the probability threshold cutoff may be between discrete, normalized thresholds. Exemplary post-processing techniques may comprise Gaussian distribution and histogram equalization.

Embodiments of the subject matter and the functional operations described in this specification can be implemented in one or more of the following: digital electronic circuitry; tangibly-embodied computer software or firmware; computer hardware, including the structures disclosed in this specification and their structural equivalents; and combinations thereof. Such embodiments can be implemented as one or more modules of computer program instructions encoded on a tangible non-transitory program carrier for execution by, or to control the operation of, data processing apparatus (i.e., one or more computer programs). Program instructions may be, alternatively or additionally, encoded on an artificially generated propagated signal (e.g., a machine-generated electrical, optical, or electromagnetic signal) that is generated to encode information for transmission to suitable receiver apparatus for execution by a data processing apparatus. And the computer storage medium can be one or more of: a machine-readable storage device, a machine-readable storage substrate, a random or serial access memory device, and combinations thereof.

As used herein, the term "data processing apparatus" comprises all kinds of apparatuses, devices, and machines for processing data, including but not limited to, a programmable processor, a computer, and/or multiple processors or computers. Exemplary apparatuses may include special purpose logic circuitry, such as a field programmable gate array ("FPGA"), a graphics processing unit ("GPU"), a tensor processing unit ("TPU"), and/or an application specific integrated circuit ("ASIC"). In addition to hardware, exemplary apparatuses may comprise code that creates an execution environment for the computer program (e.g., code that constitutes one or more of: processor firmware, a protocol stack, a database management system, an operating system, and a combination thereof).

The term "computer program" may also be referred to or described herein as a "program," "software," a "software application," a "module," a "software module," a "script," or simply as "code." A computer program may be written in any form of programming language, including compiled or interpreted languages, or declarative or procedural languages, and it can be deployed in any form, including as a standalone program or as a module, component, subroutine, or other unit suitable for use in a computing environment. Such software may correspond to a file in a file system. A program can be stored in a portion of a file that holds other programs or data. For example, a program may include one or more scripts stored in a markup language document; in a single file dedicated to the program in question; or in multiple coordinated files (e.g., files that store one or more modules, sub programs, or portions of code). A computer program can be deployed and/or executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, such as but not limited to an FPGA and/or an ASIC.

Computers suitable for the execution of the one or more computer programs include, but are not limited to, general purpose microprocessors, special purpose microprocessors, and/or any other kind of central processing unit ("CPU"). Generally, CPU will receive instructions and data from a read only memory ("ROM") and/or a RAM. The essential elements of a computer are a CPU for performing or executing instructions and one or more memory devices for storing instructions and data. Generally, a computer will also include, or be operatively coupled to receive data from or transfer data to, or both, one or more mass storage devices for storing data (e.g., magnetic, magneto optical disks, and/or optical disks). However, a computer need not have such devices. Moreover, a computer may be embedded in another device, such as but not limited to, a mobile telephone, a personal digital assistant ("PDA"), a mobile audio or video player, a game console, a Global Positioning System ("GPS") receiver, or a portable storage device (e.g., a universal serial bus ("USB") flash drive).

Computer readable media suitable for storing computer program instructions and data include all forms of nonvolatile memory, media and memory devices. For example, computer readable media may include one or more of the following: semiconductor memory devices, such as erasable programmable read-only memory ("EPROM"), electrically erasable programmable read-only memory ("EEPROM") and/or and flash memory devices; magnetic disks, such as internal hard disks or removable disks; magneto optical disks; and/or CD ROM and DVD-ROM disks. The processor and the memory can be supplemented by, or incorporated in, special purpose logic circuitry.

To provide for interaction with a user, embodiments may be implemented on a computer having any type of display device for displaying information to a user. Exemplary display devices include, but are not limited to one or more of: projectors, cathode ray tube ("CRT") monitors, liquid crystal displays ("LCD"), light-emitting diode ("LED") monitors and/or organic light-emitting diode ("OLED") monitors. The computer may further comprise one or more input devices by which the user can provide input to the computer. Input devices may comprise one or more of: keyboards, a pointing device (e.g., a mouse or a trackball). Input from the user can be received in any form, including acoustic, speech, or tactile input. Moreover, feedback may be provided to the user via any form of sensory feedback (e.g., visual feedback, auditory feedback, or tactile feedback). A computer can interact with a user by sending documents to and receiving documents from a device that is used by the user (e.g., by sending web pages to a web browser on a user's device in response to requests received from the web browser).

Embodiments of the subject matter described in this specification can be implemented in a computing system that includes one or more of the following components: a backend component (e.g., a data server); a middleware component (e.g., an application server); a frontend component (e.g., a client computer having a graphical user interface ("GUI") and/or a web browser through which a user can interact with an implementation of the subject matter described in this specification); and/or combinations thereof. The components of the system can be interconnected by any form or medium of digital data communication, such as but not limited to, a communication network. Non-limiting examples of communication networks include a local area network ("LAN") and a wide area network ("WAN"), e.g., the Internet.

The computing system may include clients and/or servers. The client and server may be remote from each other and interact through a communication network. The relationship of client and server arises by virtue of computer programs running on the respective computers and having a client-server relationship to each other.

Various embodiments are described in this specification, with reference to the detailed description above, the accompanying drawings, and the claims. Numerous specific details are described to provide a thorough understanding of various embodiments. However, in certain instances, well-known or conventional details are not described in order to provide a concise discussion. The figures are not necessarily to scale, and some features may be exaggerated or minimized to show details of particular components. Therefore, specific structural and functional details disclosed herein are not to be interpreted as limiting, but merely as a basis for the claims and as a representative basis for teaching one skilled in the art to variously employ the embodiments.

The embodiments described and claimed herein and drawings are illustrative and are not to be construed as limiting the embodiments. The subject matter of this specification is not to be limited in scope by the specific examples, as these examples are intended as illustrations of several aspects of the embodiments. Any equivalent examples are intended to be within the scope of the specification. Indeed, various modifications of the disclosed embodiments in addition to those shown and described herein will become apparent to those skilled in the art, and such modifications are also intended to fall within the scope of the appended claims.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

All references including patents, patent applications and publications cited herein are incorporated herein by reference in their entirety and for all purposes to the same extent as if each individual publication or patent or patent application was specifically and individually indicated to be incorporated by reference in its entirety for all purposes.

This application claims the benefit of priority to U.S. Provisional Application No. 62/806,475, filed Feb. 15, 2019, which application is hereby incorporated by reference in its entirety.

What is claimed is:

1. An image processing system, comprising:
at least one nontransitory processor-readable storage medium storing at least one of processor-executable instructions or data, the data including magnetic resonance imaging (MRI) image data; and
at least one processor communicatively coupled to the at least one nontransitory processor-readable storage medium, in operation the at least one processor:
accesses the MRI image data;
calculates, based on a trained convolutional neural network (CNN) model, a segmentation mask applicable to the MRI image data, wherein the segmentation mask differentiates static tissue and non-static tissue, wherein the trained CNN model was trained using a loss function to compare generated eddy current distortion segmentation masks for image slices with corresponding pre-generated eddy current correction mask annotations for the image slices; and
applies, using a polynomial fitting function, the segmentation mask to the MRI image data to produce a corrected image which accounts for eddy current distortion in the MRI image data.

2. The image processing system of claim 1, wherein the trained CNN model was trained using a differentiable loss function comprising weighted and unweighted cross entropy, weighted and unweighted L2 loss, log dice index, or log jaccard index.

3. The image processing system of claim 1, wherein the at least one processor applies one or more post-processing techniques to the calculated segmentation mask comprising conditional random fields, Gaussian blurring, dilation, erosion, hole filling, histogram equalization, or Gaussian convolving.

4. The image processing system of claim 1, wherein the at least one processor provides an adjustable probability threshold cutoff of the segmentation mask to select between one or more interpretations of the MRI image data, each interpretation associated with a tensor comprising per-pixel probability of representing static tissue or non-static tissue.

5. The image processing system of claim 1, wherein the segmentation mask is applicable to cardiac image data at any point throughout a cardiac cycle.

6. The image processing system of claim 1, wherein the segmentation mask is applicable to MRI image data comprising axial data, sagittal data, or coronal data.

7. The image processing system of claim 1, wherein the accessed MRI image data comprises at least one of 2D flow data or 4D flow data.

8. The image processing system of claim 1, wherein the trained CNN model is configured to calculate segmentations masks for 2D, 3D, or 4D MRI image data.

9. The image processing system of claim 1, wherein the trained CNN model is trained based on one or more training data inputs comprising 2D MRI image data, 3D MRI image data, or 4D MRI image data.

10. The image processing system of claim 9, wherein the dimensionality of the MRI image data to which the segmentation mask is applicable is greater than or equal to the dimensionality of the one or more training data inputs.

11. The image processing system of claim 1, wherein the trained CNN model is configured to generate segmentation masks applicable to 2D MRI image data, 3D MRI image data, or 4D MRI image data.

12. The image processing system of claim 1, wherein the trained CNN model was trained using a differentiable loss function comprising cross entropy or L2 loss.

13. A method of processing image data, the method comprising:
accessing, by at least one processor, magnetic resonance imaging (MRI) image data;
calculating, by the at least one processor and based on a trained convolutional neural network (CNN) model, a segmentation mask applicable to the MRI image data, wherein the segmentation mask differentiates static tissue and non-static tissue, wherein the trained CNN model was trained using a loss function to compare generated eddy current distortion segmentation masks for image slices with corresponding pre-generated eddy current correction mask annotations for the image slices; and applying, by the at least one processor and using a piecewise linear fitting function, the segmentation mask to the MRI image data to produce a corrected image which accounts for eddy current distortion in the MRI image data.

14. The method of claim 13, wherein the trained CNN model was trained using a differentiable loss function comprising weighted and unweighted cross entropy, weighted and unweighted L2 loss, log dice index, or log jaccard index.

15. The method of claim 13, further comprising applying one or more post-processing techniques to the calculated segmentation mask comprising conditional random fields, Gaussian blurring, dilation, erosion, hole filling, histogram equalization, or Gaussian convolving.

16. The method of claim 13, further comprising providing an adjustable probability threshold cutoff of the segmentation mask to select between one or more interpretations of the MRI image data, each interpretation associated with a tensor comprising per-pixel probability of representing static tissue or non-static tissue.

17. The method of claim 13, wherein the segmentation mask is applicable to cardiac image data at any point throughout a cardiac cycle.

18. The method of claim 13, wherein the segmentation mask is applicable to MRI image data comprising axial data, sagittal data, or coronal data.

19. The method of claim 13, wherein accessing the MRI image data comprises accessing at least one of 2D flow data or 4D flow data.

20. The method of claim 13, wherein the trained CNN model is configured to calculate segmentations masks for 2D, 3D, or 4D MRI image data.

21. The method of claim 13, wherein the trained CNN model was trained based on one or more training data inputs comprising 2D MRI image data, 3D MRI image data, or 4D MRI image data.

22. The method of claim 21, wherein the dimensionality of the MRI image data to which the segmentation mask is applicable is greater than or equal to the dimensionality of the one or more training data inputs.

23. The method of claim 13, wherein the trained CNN model is configured to generate segmentation masks applicable to 2D MRI image data, 3D MRI image data, or 4D MRI image data.

24. The method of claim 13, wherein the trained CNN model was trained using a differentiable loss function comprising log dice index or log jaccard index.

* * * * *